(12) United States Patent
Zhang et al.

(10) Patent No.: US 8,258,426 B2
(45) Date of Patent: Sep. 4, 2012

(54) LASER MATERIAL REMOVAL METHODS AND APPARATUS

(75) Inventors: Zhenhua Zhang, Newark, CA (US); Virendra V. S. Rana, Los Gatos, CA (US); Vinay K. Shah, San Mateo, CA (US); Chris Eberspacher, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 538 days.

(21) Appl. No.: 12/545,488

(22) Filed: Aug. 21, 2009

(65) Prior Publication Data

US 2010/0055901 A1    Mar. 4, 2010

Related U.S. Application Data

(60) Provisional application No. 61/092,044, filed on Aug. 26, 2008.

(51) Int. Cl.
*B23K 26/00* (2006.01)
*B23K 26/02* (2006.01)

(52) U.S. Cl. ......... 219/121.67; 219/121.68; 219/121.78; 219/121.82

(58) Field of Classification Search ............. 219/121.67, 219/490, 121.68, 121.78, 121.72, 121.82, 219/121.8
See application file for complete search history.

(56) References Cited

U.S. PATENT DOCUMENTS

| 4,144,493 | A | 3/1979 | Lee et al. |
|---|---|---|---|
| 4,773,944 | A | 9/1988 | Nath et al. |
| 4,892,592 | A | 1/1990 | Dickson et al. |
| 5,248,349 | A | 9/1993 | Foote et al. |
| 5,258,077 | A | 11/1993 | Shahryar |
| 5,910,854 | A | 6/1999 | Varaprasad et al. |

(Continued)

FOREIGN PATENT DOCUMENTS

JP    06-140570 A    5/1994

(Continued)

OTHER PUBLICATIONS

Javier Alda, "Laser and Gaussian Beam Propagation and Transformation." Encyclopedia of Optical Engineering, pp. 999-1013, 2003.

(Continued)

*Primary Examiner* — Michael Trinh
(74) *Attorney, Agent, or Firm* — Patterson & Sheridan, LLP

(57) ABSTRACT

Embodiments of the present invention generally provide methods and apparatus for material removal using lasers in the fabrication of solar cells. In one embodiment, an apparatus is provided that precisely removes portions of a dielectric layer deposited on a solar cell substrate according to a desired pattern and deposits a conductive layer over the patterned dielectric layer. In one embodiment, the apparatus also removes portions of the conductive layer in a desired pattern. In certain embodiments, methods for removing a portion of a material via a laser without damaging the underlying substrate are provided. In one embodiment, the intensity profile of the beam is adjusted so that the difference between the maximum and minimum intensity within a spot formed on a substrate surface is reduced to an optimum range. In one example, the substrate is positioned such that the peak intensity at the center versus the periphery of the substrate is lowered. In one embodiment, the pulse energy is improved to provide thermal stress and physical lift-off of a desired portion of a dielectric layer.

17 Claims, 15 Drawing Sheets

U.S. PATENT DOCUMENTS

| | | | |
|---|---|---|---|
| 5,956,572 A | 9/1999 | Kidoguchi et al. | |
| 6,077,722 A | 6/2000 | Jansen et al. | |
| 6,265,242 B1 | 7/2001 | Komori et al. | |
| 6,281,696 B1 | 8/2001 | Voogel | |
| 6,300,593 B1 * | 10/2001 | Powell | 219/121.68 |
| 6,423,565 B1 | 7/2002 | Barth et al. | |
| 6,429,037 B1 | 8/2002 | Wenham et al. | |
| 6,455,347 B1 | 9/2002 | Hiraishi et al. | |
| 6,559,411 B2 | 5/2003 | Borgeson et al. | |
| 6,578,764 B1 | 6/2003 | Hiraishi et al. | |
| 6,784,361 B2 | 8/2004 | Carlson et al. | |
| 6,841,728 B2 | 1/2005 | Jones et al. | |
| 6,919,530 B2 | 7/2005 | Borgeson et al. | |
| 7,259,321 B2 * | 8/2007 | Oswald et al. | 136/244 |
| 7,353,076 B2 * | 4/2008 | Nagayasu et al. | 700/112 |
| 7,880,155 B2 * | 2/2011 | Krupyshev et al. | 250/559.3 |
| 2001/0037823 A1 | 11/2001 | Middelman et al. | |
| 2002/0117199 A1 | 8/2002 | Oswald | |
| 2003/0044539 A1 | 3/2003 | Oswald | |
| 2003/0129810 A1 | 7/2003 | Barth et al. | |
| 2006/0103371 A1 | 5/2006 | Manz | |
| 2006/0196536 A1 | 9/2006 | Fujioka et al. | |
| 2007/0232009 A1 * | 10/2007 | Schulz | 438/366 |
| 2008/0012189 A1 | 1/2008 | Manz | |
| 2008/0105295 A1 | 5/2008 | Manz | |
| 2008/0115827 A1 | 5/2008 | Woods et al. | |
| 2009/0000108 A1 | 1/2009 | Manz | |
| 2009/0077805 A1 | 3/2009 | Bachrach et al. | |
| 2009/0162972 A1 | 6/2009 | Xu et al. | |
| 2009/0321399 A1 * | 12/2009 | Inagawa et al. | 219/121.69 |
| 2010/0055901 A1 | 3/2010 | Zhang et al. | |
| 2010/0087028 A1 | 4/2010 | Porthouse et al. | |

FOREIGN PATENT DOCUMENTS

| | | |
|---|---|---|
| JP | 2001-250966 A | 9/2001 |
| JP | 2003-168645 A | 6/2003 |
| JP | 2004-303766 A | 10/2004 |
| JP | 2004-342455 | 12/2004 |
| WO | WO-2008/092186 | 8/2008 |

OTHER PUBLICATIONS

Guassian Beam Propagation, www.mellesgriot.com, pp. 2.2-2.5.

PCT International Search Report and Written Opinion dated Mar. 18, 2010 for International Application No. PCT/US2009/054677.

International Search Report and Written Opinion dated Jun. 8, 2011 for International Application No. PCT/US2010/050414.

Morilla, et al. "Laser Induced Ablation and Doping Processes on High Efficiency Silicon Solar Cells", 23rd EUPVSEC (Valencia, Spain), 2008, 4 pages.

* cited by examiner

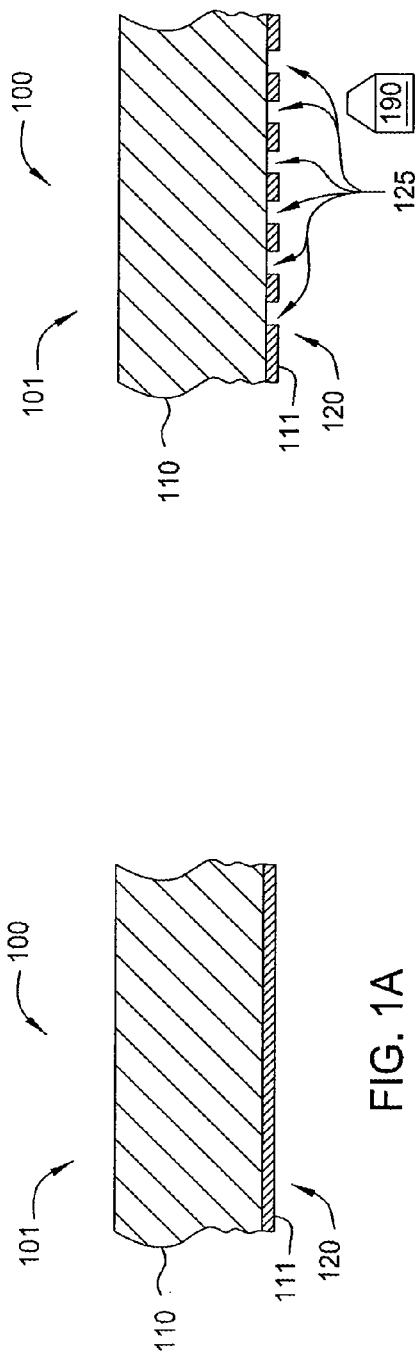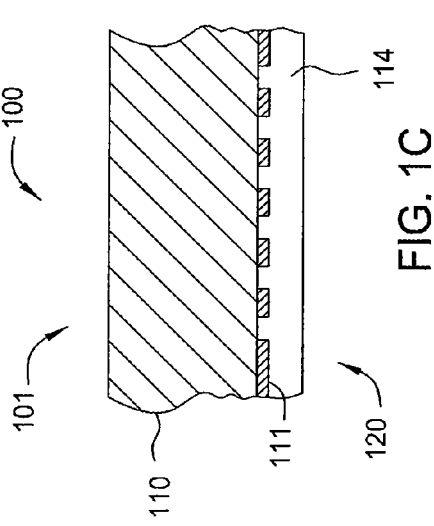

LASER MATERIAL REMOVAL METHODS AND APPARATUS

CROSS-REFERENCE TO RELATED APPLICATIONS

This application claims benefit of U.S. Provisional Patent Application Ser. No. 61/092,044, filed Aug. 26, 2008, which is herein incorporated by reference in its entirety.

BACKGROUND OF THE INVENTION

1. Field of the Invention

Embodiments of the present invention generally relate to the fabrication of photovoltaic cells. In particular, embodiments of the present invention relate to apparatus and methods for laser removal of portions of material layers according to a desired pattern.

2. Description of the Related Art

Solar cells are photovoltaic (PV) devices that convert sunlight directly into electrical power. The most common solar cell material is silicon, which is in the form of single or multicrystalline substrates, sometimes referred to as wafers. Because the amortized cost of forming silicon-based solar cells to generate electricity is currently higher than the cost of generating electricity using traditional methods, it is desirable to reduce the cost to form solar cells.

Various approaches enable fabricating active regions, passivation regions, and conductors of solar cells. However, several issues exist with such prior manufacturing methods and apparatus. For example, current methods that provide for laser removal of portions of dielectric and conductive layers during solar cell fabrication are time consuming and can lead to damaging the underlying substrate.

Therefore, there is a need for improved laser removal techniques and apparatus for removing portions of layers and improving substrate throughput during the fabrication of solar cells.

SUMMARY OF THE INVENTION

In one embodiment of the present invention, an apparatus for material removal comprises a first robot configured to transfer a substrate having a dielectric layer deposited on a first surface thereof from an input region to one of a plurality of support features on a substrate transport surface, a vision system configured to detect an actual position of the substrate and communicate information regarding the actual position to a system controller, a first laser scanner positioned to remove a portion of the dielectric layer in a desired pattern, and an automation system configured to transport the substrate having a patterned dielectric layer from the first laser scanner to a deposition chamber configured to deposit a conducting layer over the dielectric layer. In one embodiment, the system controller is configured to determine an offset of the actual position with respect to an expected position of the substrate and adjust either the first robot or the laser scanner to correct for the offset.

In another embodiment, a laser material removal method comprises determining a laser ablation threshold of a material deposited on a substrate, altering either a position of the substrate or parameters of a laser by defocusing the laser such that a portion of light emitted from the laser strikes the substrate beneath the ablation threshold, and ablating the material without damaging the underlying substrate.

In another embodiment, a method of laser material removal comprises thermally stressing a region of dielectric material deposited on a substrate by focusing light emitted from a laser on the region and physically removing material from the region without evaporating the material.

In another embodiment of the present invention, a processing comprises a first robot configured to transfer a substrate from an input region to one of a plurality of support features on a substrate transport surface, a vision system configured to detect an actual position of the substrate and communicate information regarding the actual position to a system controller, a first deposition chamber configured to deposit a dielectric layer onto the substrate, a first laser scanner positioned to remove a portion of the dielectric layer from the substrate in a desired pattern while the substrate is positioned on the substrate transport surface, a second deposition chamber configured to deposit a conducting layer over the patterned dielectric layer, and an automation system configured to transport the substrate between the first deposition chamber, the first laser scanner, and the second deposition chamber. In one embodiment, the system controller is configured to determine an offset of the actual position with respect to an expected position of the substrate and adjust the laser scanner to correct for the offset.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1E illustrate schematic cross-sectional views of a solar cell substrate during different stages in a processing sequence used to form a contact structure on a surface of a solar cell.

DETAILED DESCRIPTION

Figure 1E:
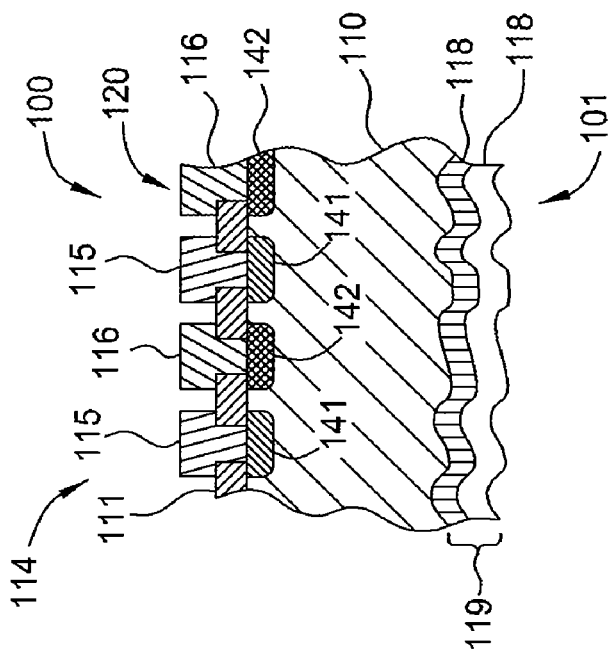

Embodiments of the present invention generally provide methods and apparatus for material removal using lasers in the fabrication of solar cells. In one embodiment, an apparatus is provided that precisely removes portions of a dielectric layer deposited on a solar cell substrate according to a desired pattern and deposits a conductive layer over the patterned dielectric layer. In one embodiment, the apparatus also removes portions of the conductive layer in a desired pattern. In certain embodiments, methods for removing a portion of a material via a laser without damaging the underlying substrate are provided. In one embodiment, the intensity profile of the beam is adjusted so that the difference between the maximum and minimum intensity within a spot formed on a substrate surface is reduced to an optimum range. In one example, the substrate is positioned such that the peak intensity at the center versus the periphery of the substrate is lowered. In one embodiment, the pulse energy is improved to provide thermal stress and physical lift-off of a desired portion of a dielectric layer.

FIGS. 1A-1E illustrate schematic cross-sectional views of a solar cell substrate 110 during different stages in a processing sequence used to form a contact structure on a surface of a solar cell 100. FIG. 2 illustrates a process sequence 200 used to form the contact structure on the solar cell.

Referring to FIG. 1A, a solar cell substrate 110 has a front surface 101 and a back surface 120. In one embodiment, the substrate 110 comprises single crystal silicon, multicrystalline silicon, or polycrystalline silicon. In other embodiments, the substrate 110 may comprise organic material, germanium (Ge), gallium arsenide (GaAs), cadmium telluride (CdTe), cadmium sulfide (CdS), copper indium gallium selenide (CIGS), copper indium selenide (CuInSe$_2$), or gallium indium phosphide (GaInP$_2$) as well as heterojunction cells, such as GaInP/GaAs/Ge or ZnSe/GaAs/Ge, that are used to convert sunlight to electrical power.

At step 202, as shown in FIG. 1A, a dielectric layer 111 is formed on the back surface 120 of the substrate 110. In one embodiment, the dielectric layer 111 is a silicon oxide layer, such as a silicon dioxide layer, formed on the surface 120 of a silicon containing substrate. In one embodiment, the dielectric layer 111 is a silicon nitride layer, a silicon oxynitride layer, a silicon carbide layer, a silicon oxycarbide layer, or other similar type of layer. The dielectric layer 111 may be formed using a conventional oxidation process, such as a furnace annealing process, a rapid thermal oxidation process, an atmospheric pressure or low pressure chemical vapor deposition (CVD) process, a plasma enhanced CVD process, a physical vapor deposition (PVD) process, an evaporation process, a spray-on process, a spin-on process, a roll-on process, a screen printing process, or another similar deposition process.

In one embodiment, the dielectric layer 111 is a silicon dioxide layer that is between about 50 Å and about 3000 Å thick. In another embodiment, the dielectric layer 111 is a silicon dioxide layer that is less than about 2000 Å thick. In one embodiment, the dielectric layer 111 is a silicon nitride layer having a thickness between about 100 Å and about 1000 Å. In another embodiment, the dielectric layer 111 comprises a multilayer film stack, such as a silicon oxide/silicon nitride layer stack, an amorphous silicon/silicon oxide layer stack, or an amorphous silicon/silicon nitride layer stack. In one embodiment, the silicon oxide layer is between about 20 Å and about 3000 Å thick, and the silicon nitride layer is between about 100 Å and about 1000 Å thick. In one embodiment, the amorphous silicon layer is between about 30 Å and about 100 Å thick, and the silicon oxide layer is between about 100 Å and about 3000 Å thick. In one embodiment, the amorphous silicon layer is between about 30 Å and about 100 Å thick, and the silicon nitride layer is between about 100 Å and about 1000 Å thick.

In step 204, regions 125 of the back surface 120 of the substrate 110 are exposed as shown in FIG. 1B. In one embodiment, the regions 125 are exposed by removing portions of the dielectric layer 111 using one or more laser devices 190. In one embodiment, the laser device 190 is a solid state laser, such as Nd:YAG laser, Nd:YVO$_4$ laser, or a fiber laser. Methods for removing the dielectric layer 111 using one or more lasers are subsequently described in the section entitled, "Laser Removal Methods."

In step 206, as shown in FIG. 1C, a conducting layer 114 is deposited over the dielectric layer 111 on the back surface 120 of the substrate 110. The conducting layer 114 is electrically connected to the substrate 110 through the exposed regions 125 on the back surface 120 of the substrate 110. In one embodiment, the formed conducting layer 114 is between about 500 Å and about 500,000 Å thick and contains a metal, such as copper (CU), silver (Ag), tin (Sn), cobalt (Co), rhenium (Rh), nickel (Ni), zinc (Zn), lead (Pb), and/or aluminum (Al). In one embodiment, the conducting layer 114 is an aluminum (Al) layer formed by a PVD process or an evaporation process. In one embodiment, the conducting layer 114 includes two layers that are formed by first depositing an aluminum (Al) layer by a PVD process or evaporation process, and then depositing a nickel vanadium (NiV) capping layer by a PVD process.

In embodiments in which the conducting layer 114 is applied over an interdigitated all back contact solar cell structure, it may be desirable to pattern the deposited conducting layer 114 to form isolated regions. In such embodiments, step 208 is performed, as shown in FIG. 1D. In one embodiment, material is removed from the conducting layer 114 in regions 130 by use of the same or another laser device 190 to form conductive features 115 and 116, which are each electrically connected to active regions formed in the substrate 110. In one embodiment, the conductive feature 115 is in electrical contact with a p-type doped region 141 in the substrate 110, and the conductive feature 116 is in electrical contact with an n-type doped region 142 formed in the substrate 110, both of which form portions of the active region of the solar cell 100.

Figure 1D:
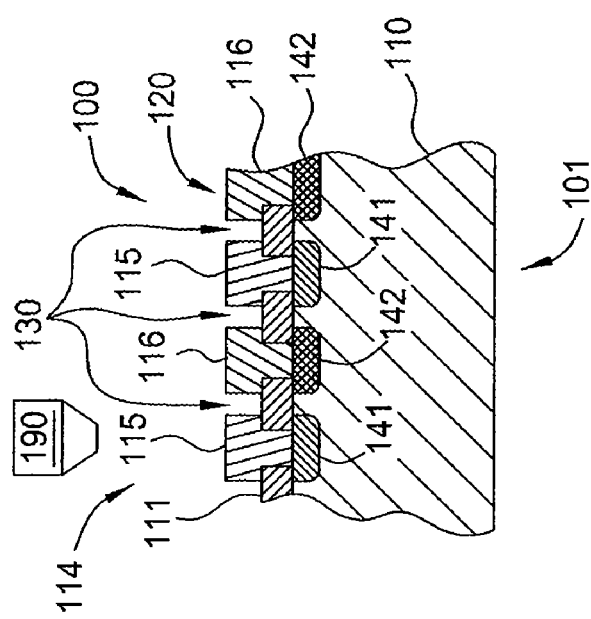
Figure 2:
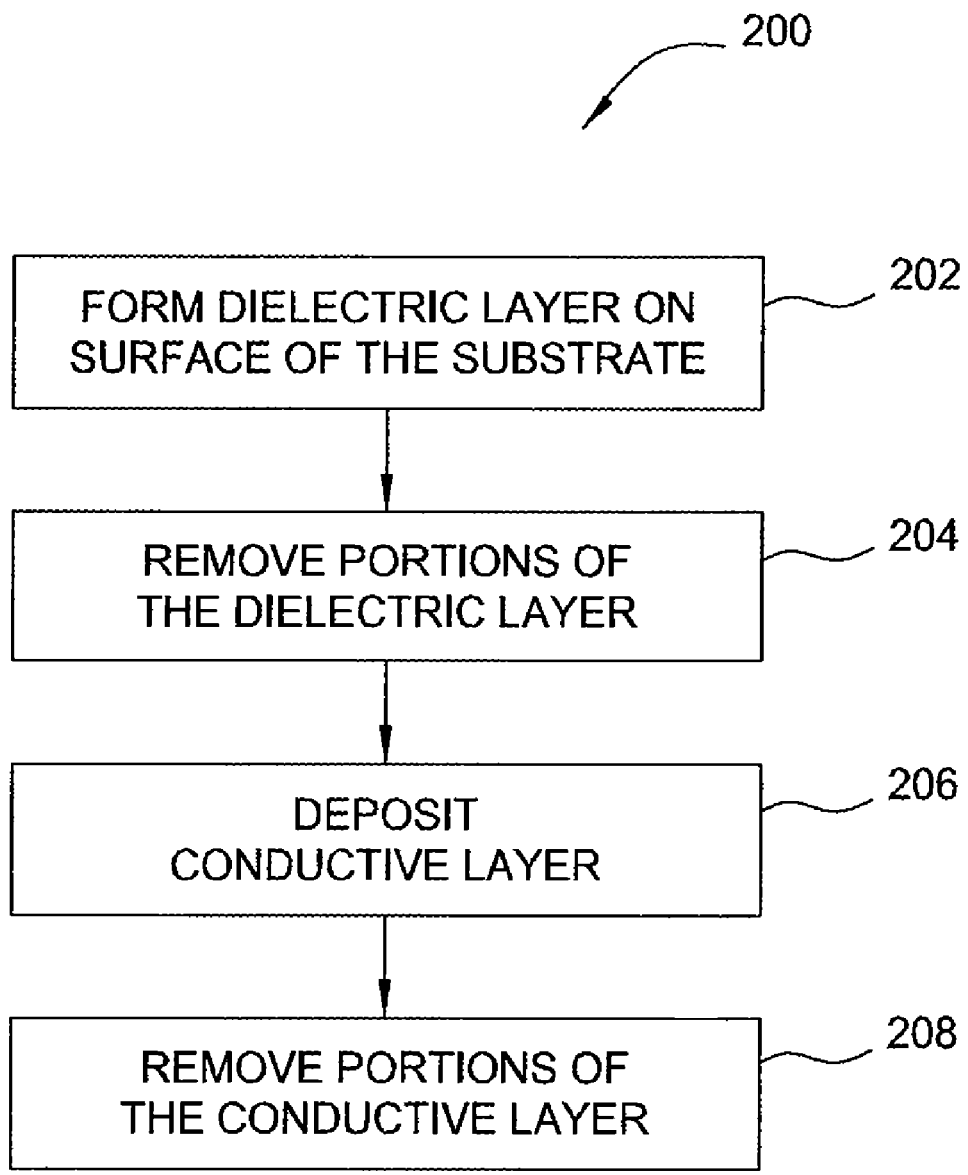
FIG. 2 illustrates a process sequence used to form a contact structure on a solar cell.

Subsequently, various processing steps may be performed to prepare and/or texture the front surface 101 of the substrate, as shown in FIG. 1E. In one embodiment, the front surface 101 is adapted to receive sunlight after the solar cell has been formed. In one case, the front surface 101 is textured and then selectively doped using either a spray-on or a vapor phase, high temperature diffusion process. The front surface 101 is then passivated by depositing an antireflection (ARC) layer 119 (e.g., silicon nitride). In one embodiment a heterojunction type solar cell structure having one or more active layers 118 (e.g., i-n type layer on a p-type substrate) is formed on the textured front surface 101. In one embodiment, the preparation of the front surface 101 is performed prior to performing the process sequence 200. In one embodiment, after preparing the front surface 101, one or more conductive front contact lines (not shown) may be formed thereon using conventional processes to form a front contact structure of the solar cell 100.

In one embodiment, portions of one or more of the layers disposed on the front surface 101 of the substrate 110 are removed using one or more laser devices, such as laser devices 190 (discussed above). Methods for removing the passivation and/or ARC layers are subsequently described in the section entitled "Laser Removal Methods." In one example, one or more conductive front contact lines (or fingers) are then deposited over the regions exposed by the laser removal process. The one or more conductive front contact lines may then be further treated to assure that a desirable electrical connection is formed to the substrate 110 through the exposed regions on the front surface 101 of the substrate 110. In one embodiment, the one or more conductive front contact lines contain a metal, such as copper (Cu), silver (Ag), tin (Sn), cobalt (Co), rhenium (Rh), nickel (Ni), zinc (Zn), lead (pb), and/or aluminum (Al).

Figure 3A:
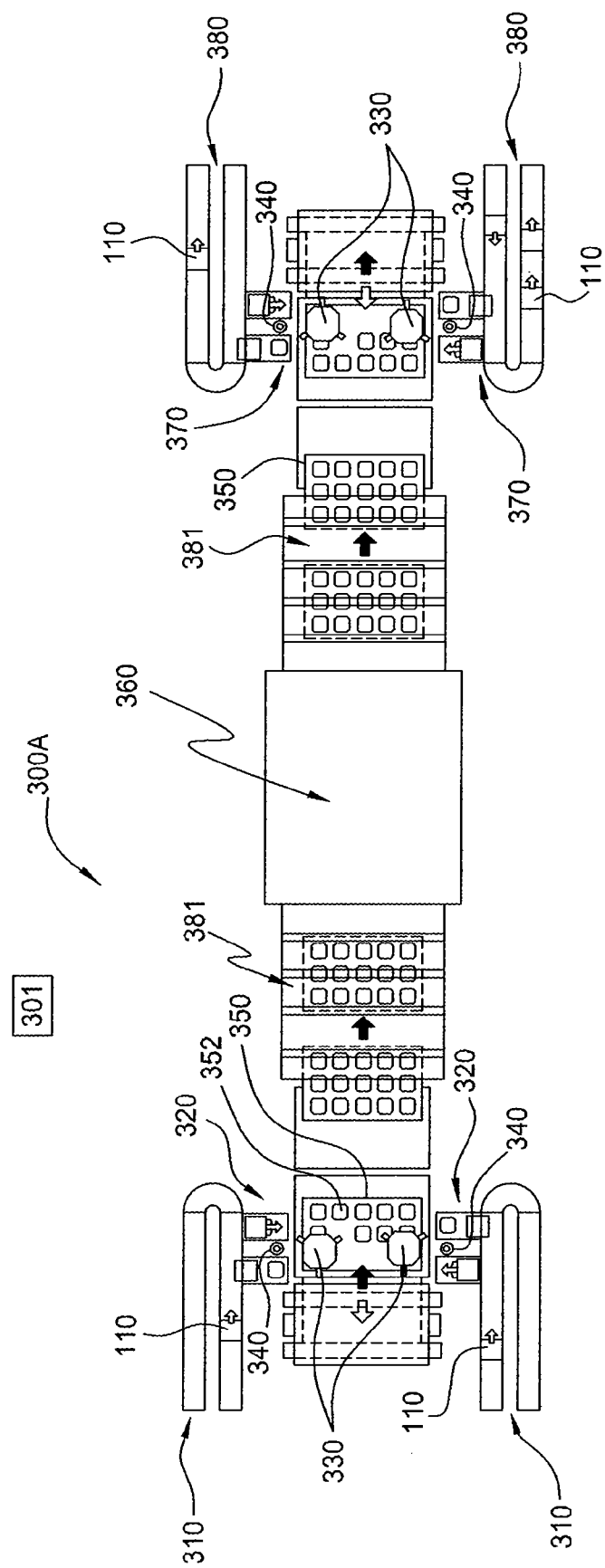
FIG. 3A is a schematic plan view of an apparatus for performing a process sequence according to one embodiment of the present invention.
Figure 3B:
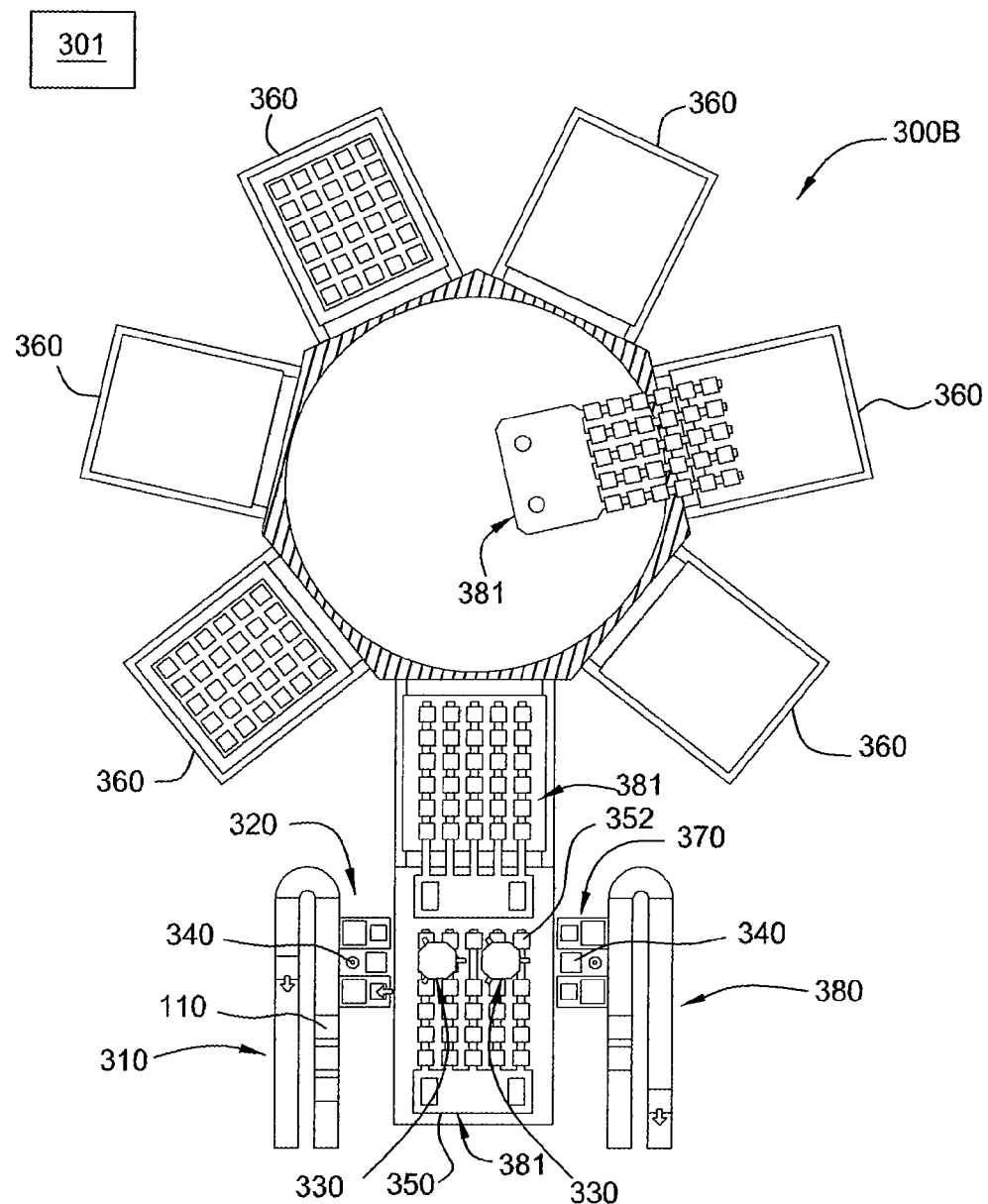
FIG. 3B is a schematic plan view of an apparatus for performing a process sequence according to another embodiment of the present invention.

FIG. 3A is a schematic plan view of an apparatus 300A for performing steps 204-208 according to one embodiment of the present invention. FIG. 3B is a schematic plan view of an apparatus 300B for performing steps 204-208 according to another embodiment of the present invention. In one embodiment, substrates 110 having a dielectric layer 111 deposited on the back surface 120 thereof are transported into a receiving region 320 via an incoming conveyor 310. In one embodiment, the substrates 110 are individually transported on the incoming conveyor 310. In another embodiment, the substrates 110 are transported in cassettes. In another embodiment, the substrates 110 are transported in stack boxes. In one embodiment, once each individual substrate 110 is delivered into the receiving region 320, a transfer robot 330 retrieves each substrate 110 from the receiving region 320 and holds the substrate 110 over a vision system 340.

Figure 4:
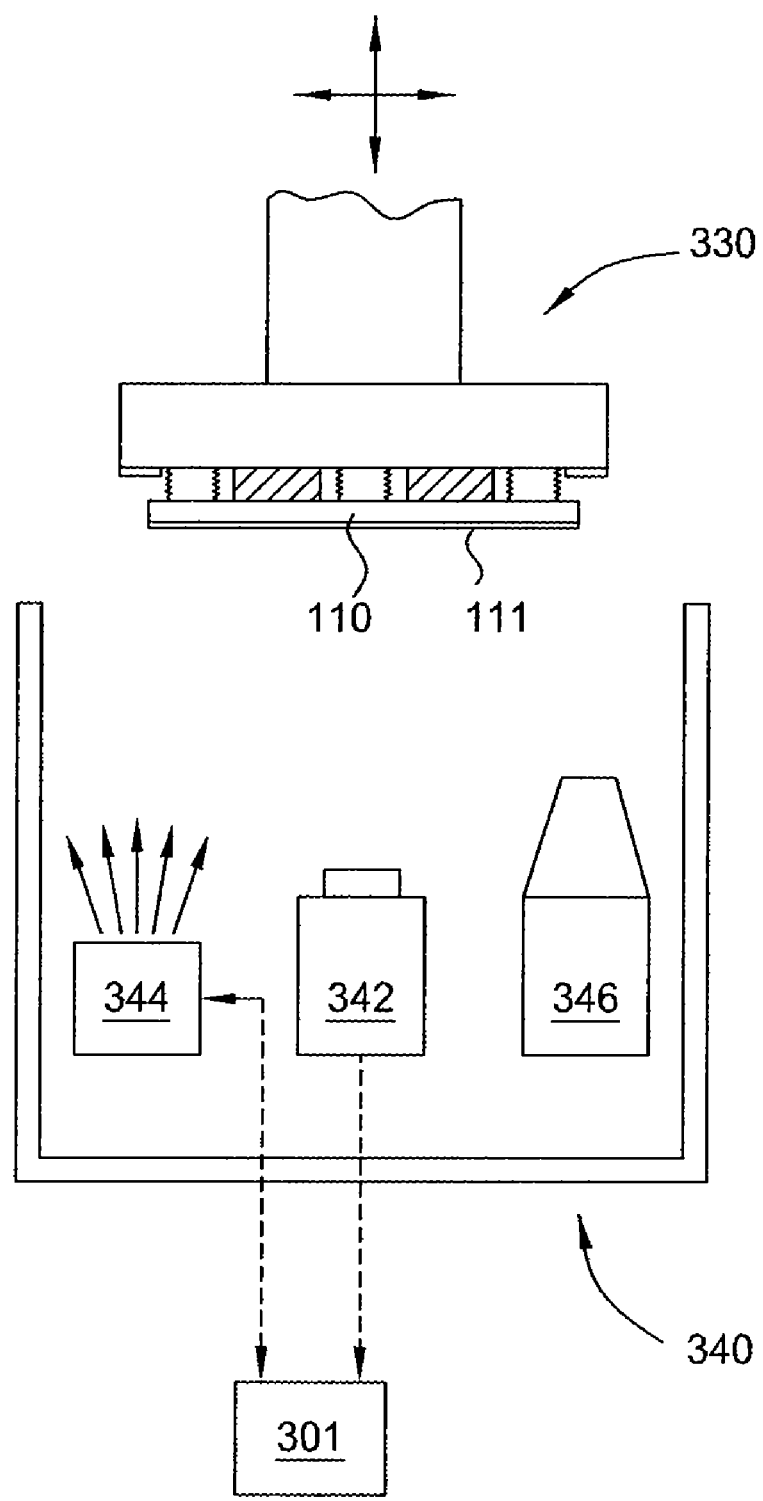
FIG. 4 is a schematic side view of a robot holding a substrate over a vision system according to one embodiment of the present invention.

FIG. 4 is a schematic side view of a robot 330 holding a substrate 110 over the vision system 340. In one embodiment, the vision system 340 comprises an upward looking inspection device 342, an illumination source 344, and a laser scanner 346. In one embodiment, the inspection device 342 is a camera, such as a color or black and white camera. In one embodiment, the illumination source 344 is a light emitting diode (LED) source configured to emit light in a specified wavelength range. In another embodiment, the illumination source 344 comprises a broadband lamp and one or more filters (not shown) for emitting desired wavelengths of light toward the substrate 110. In one embodiment, the laser scanner 346 comprises a solid state laser, such as the laser device 190 previously described. In one embodiment, the inspection device 342, the illumination source 344, and the laser scanner 346 are in communication with a system controller 301.

The system controller 301 facilitates the control and automation of the overall apparatus 300A or 300B and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, optical inspection assemblies, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 301 determines which tasks are performable on a substrate. Preferably, the program is software readable by the system controller 301, which includes code to generate and store at least substrate positional information, the sequence of movement of the various controlled components, substrate optical inspection system information, and any combination thereof.

In one embodiment, as the robot 330 holds the substrate 110 over the vision system 340, the inspection device 342 and the illumination source 344 work in conjunction with the system controller 301 to determine the precise position of the substrate 110 with respect to the laser scanner 346. The measurement is then used to precisely align the substrate 110 with respect to the laser scanner 346 for laser patterning. In one embodiment, the measurement is used to precisely align the laser scanner 346 with respect to the substrate 110 for laser patterning. The laser scanner 346 then removes portions of the dielectric layer 111 in a desired pattern according to step 204 described above. Following patterning, the patterned surface of the substrate 110 may be inspected by the inspection device 342 prior to further processing.

In another embodiment, the vision system 340 is located within the receiving region 320. In this embodiment, the illumination source 344 may be located on one side of the substrate 110 and the inspection device 342 may be located on the opposite side of the substrate 110. For instance, the inspection device 342 may be located above the substrate 110, while the illumination source 344 is located beneath the substrate 110. In this embodiment, the illumination source 344 may provide back lighting while the inspection device 342 captures images of the substrate 110 and communicates those images to the system controller 301.

Referring back to FIG. 3, the robot 330 then places the patterned substrate 110 into a specified feature 352 on a substrate transport surface 350. In one embodiment, the features 352 are pockets and the substrate transport surface 350 is a substrate carrier. In another embodiment, the features 352 are support elements and the substrate transport surface 350 comprises a plurality of lateral arms on a substrate handling robot. In another embodiment, the features 352 are support elements or pockets, and the substrate transport surface 350 is a platform portion of an automation system 381, such as an upper surface of a substrate conveyor. After each of the features 352 of the substrate transport surface 350 are filled with patterned substrates 110, the substrates 110 are transported into a deposition chamber 360, such as a PVD chamber or an evaporation chamber, via the automation system 381. In one embodiment, the automation system 381 comprises rollers (not shown) and actuators (not shown) for linearly moving the substrates 110 on the substrate transport surface 350. In one embodiment, the automation system 381 is the substrate handling robot. In the deposition chamber 360, the conducting layer 114 is deposited over the patterned dielectric layer 111 according to step 206 described above.

In one embodiment, after the conducting layer 114 is deposited, the substrates 110 are transported out of the deposition chamber 360 on the substrate transport surface 350 via the automation system 381. At that point, the same or another robot 330 may remove an individual substrate 110 from its respective feature 352 and hold it over the same or another vision system 340. In one embodiment, the precise positioning of the substrate 110 is again determined by the inspection device 342 and the illumination source 344 in conjunction with the system controller 301. This measurement may then be used to precisely align the substrate 110 with respect to the laser scanner 346 or the laser scanner 346 with respect to the substrate 110 for laser patterning of the conducting layer 114 in accordance with step 208 described above. In one embodiment, the patterned conducting layer 114 may then be inspected by the vision system 340. The robot 330 then places the substrate 110 into an exit region 370, where it may them be transported away from the apparatus 300A or 300B on an outgoing conveyor 380.

The embodiments illustrated in FIGS. 3A and 3B provide for extremely precise positioning of the laser patterns on layers of the substrate 110 since each individual substrate 110 is located with respect to the coordinate system of the laser scanner 346. This embodiment also allows for a relatively simple laser head design since the laser operating area is limited to the size of a single substrate 110. Additionally, the potential for substrate breakage is minimized since each substrate is only moved by the robot 340 once on the pre-deposition side and once on the post-deposition side of the deposition chamber 360.

Figure 5A:
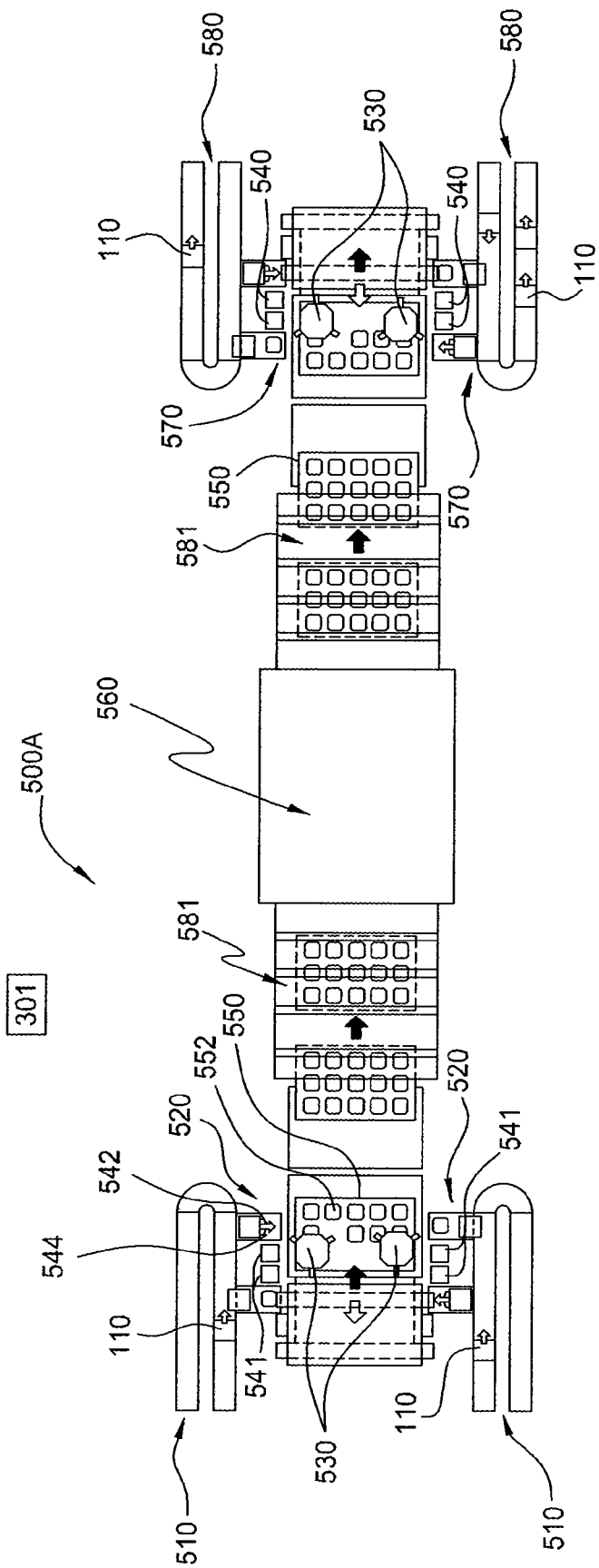
FIG. 5A is a schematic plan view of an apparatus for performing a process sequence according to another embodiment of the present invention.
Figure 5B:
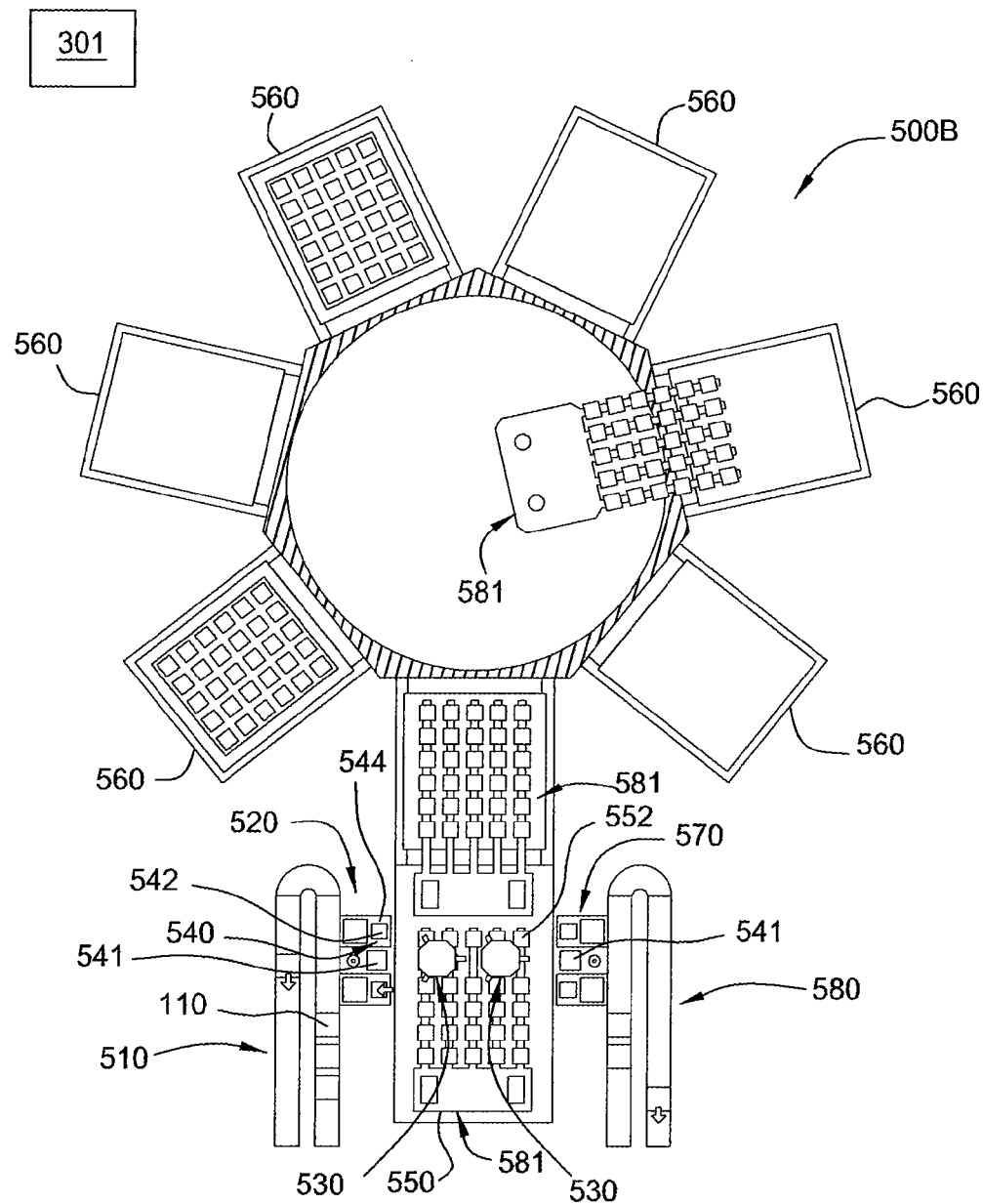
FIG. 5B is a schematic plan view of an apparatus for performing a process sequence according to another embodiment of the present invention.

FIG. 5A is a schematic plan view of an apparatus 500A for performing steps 204-208 according to another embodiment of the present invention. FIG. 5B is a schematic plan view of an apparatus 500B for performing steps 204-208 according to another embodiment of the present invention. In one embodiment, substrates 110 having a dielectric layer 111 deposited on the back surface 120 thereof are transported into a receiving region 520 via an incoming conveyor 510. In one embodiment, the substrates 110 are individually transported on the incoming conveyor 510. In another embodiment, the substrates 110 are transported in cassettes. In another embodiment, the substrates 110 are transported in stack boxes.

In one embodiment, a vision system 540 is located within the receiving region 520. In this embodiment, an illumination source 544 may be located on one side of the substrate 110 and the inspection device 542 may be located on the opposite side of the substrate 110. For instance, the inspection device 542 may be located above the substrate 110, while the illumination source 544 is located beneath the substrate 110. In this embodiment, the illumination source 544 may provide back lighting while the inspection device 542 captures images of the substrate 110 and communicates those images to the system controller 301. In one embodiment, the inspection device 542 and the illumination source 544 work in conjunction with the system controller 301 to determine the precise position of the substrate 110.

Figure 6:
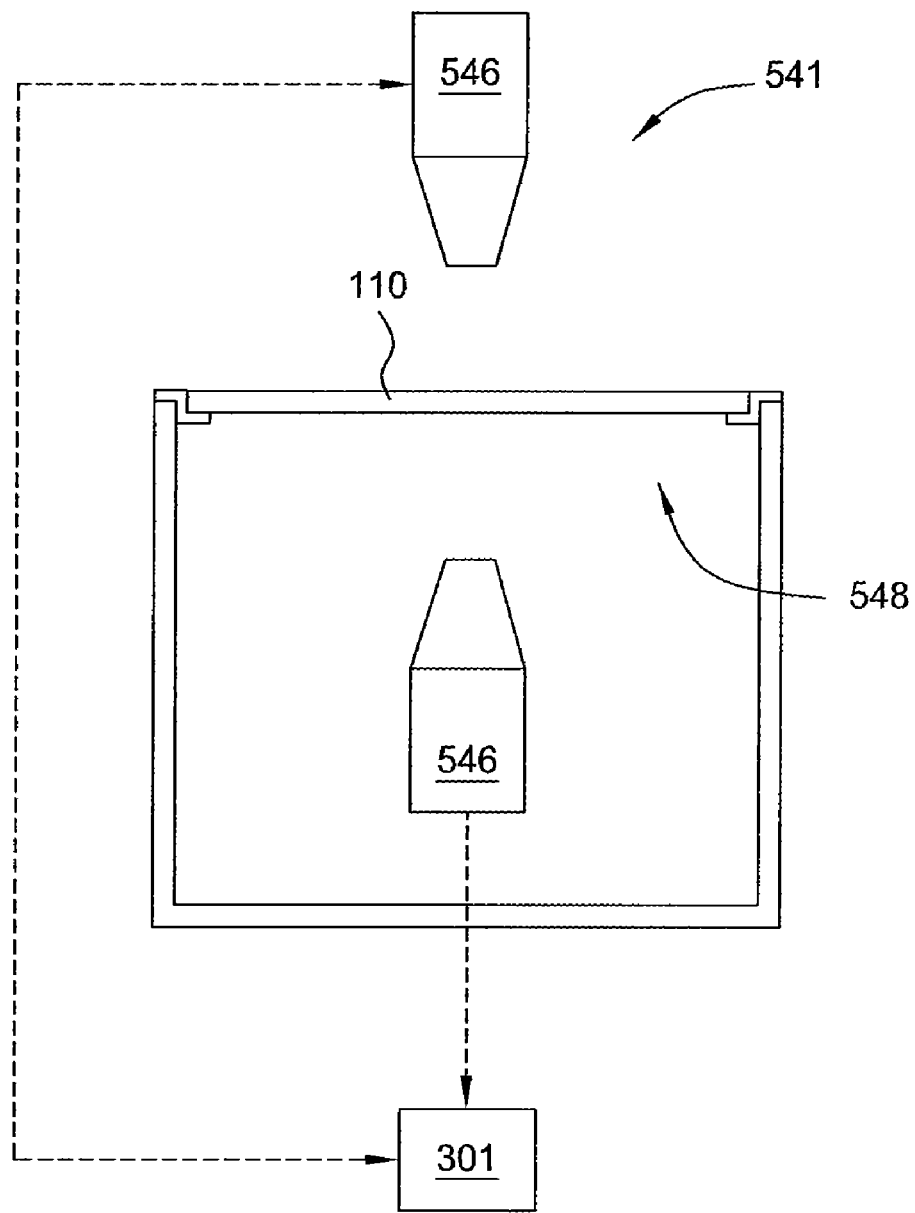
FIG. 6 is a schematic side view of a substrate positioned in a substrate holder according to one embodiment of the present invention.

In one embodiment, once each individual substrate 110 is delivered into the receiving region 520, a transfer robot 530 retrieves the substrate 110 from the receiving region 520 and places the substrate 110 onto a substrate holder 541 using the information regarding the position of the substrate 110. FIG. 6 is a schematic side view of a substrate 110 positioned in the substrate holder 541. In one embodiment, the substrate holder 541 comprises a substrate pocket 548 and a laser scanner 546 positioned beneath the substrate pocket 548 in the case where the dielectric layer 111 is provided on the side of the substrate 110 that is facing down. In an embodiment, where the dielectric layer 111 is provided on the side of the substrate 110 that is facing up, the laser scanner 546 is positioned above the substrate pocket 548. In one embodiment, the laser scanner 546 includes a solid state laser, such as the laser device 190. In one embodiment, the laser scanner 546 then removes portions of the dielectric layer 111 in a desired pattern according to step 204 described above. In one embodiment, while one substrate 110 is being patterned in one substrate pocket 548 of the substrate holder 541, another (already patterned) substrate 110 may be removed from an adjacent substrate pocket 548 and/or a third substrate 110 may be loaded onto the adjacent substrate pocket 548. In one embodiment, the substrate holder 541 may further include an inspection device 542 and an illumination source 544 for inspecting the patterned surface of the substrate 110.

Referring back to FIGS. 5A and 5B, the robot 530 then places the patterned substrate 110 into a specified feature 552 on a substrate transfer surface 550. In one embodiment, the features 552 are pockets and the substrate transport surface 550 is a substrate carrier. In another embodiment, the features 552 are support elements and the substrate transport surface 550 comprises a plurality of lateral arms on a substrate handling robot. In another embodiment, the features 552 are support elements or pockets and the substrate transport surface 550 is a platform portion of an automation system 581, such as an upper surface of a substrate conveyor. After each of the features 552 of the substrate transport surface 550 are filled with patterned substrates 110, the substrates 110 are transported into a deposition chamber 560, such as a PVD chamber or an evaporation chamber, via the automation system 581. In one embodiment, the automation system 581 comprises rollers (not shown) and actuators (not shown) for linearly moving the substrates 110 on the substrate transport surface 550. In one embodiment, the automation system 581 is the substrate handling robot. The conducting layer 114 is then deposited over the patterned dielectric layer 111 according to step 206 described above.

In one embodiment, after the conducting layer 114 is deposited, the substrates 110 are transported out of the deposition chamber 560. At that point, the same or another robot 530 may remove an individual substrate 110 from its respective feature 552 and place it into the same or another substrate holder 541. The laser scanner 546 may then laser pattern the conducting layer 114 in accordance with step 208 described above. In one embodiment, the inspection device 542 and illumination source 544 may be used to inspect the patterned conducting layer 114. In one embodiment, the robot 530 then places the substrate 110 into an exit region 570, where it may them be transported away from the apparatus 500A or 500B on an outgoing conveyor 580.

The embodiments illustrated in FIGS. 5A and 5B provide for extremely precise positioning of the laser patterns on layers of the substrate 110 since each individual substrate 110 is located with respect to the coordinate system of the laser scanner 546. This embodiment also allows for a relatively simple laser head design since the laser operating area is limited to the size of two substrates 110. Additionally, increased substrate 110 throughput of the apparatus 500A or 500B may be achieved since the robot 530 may be loading/unloading one substrate 110 while an adjacent substrate 110 is being laser patterned.

Figure 7A:
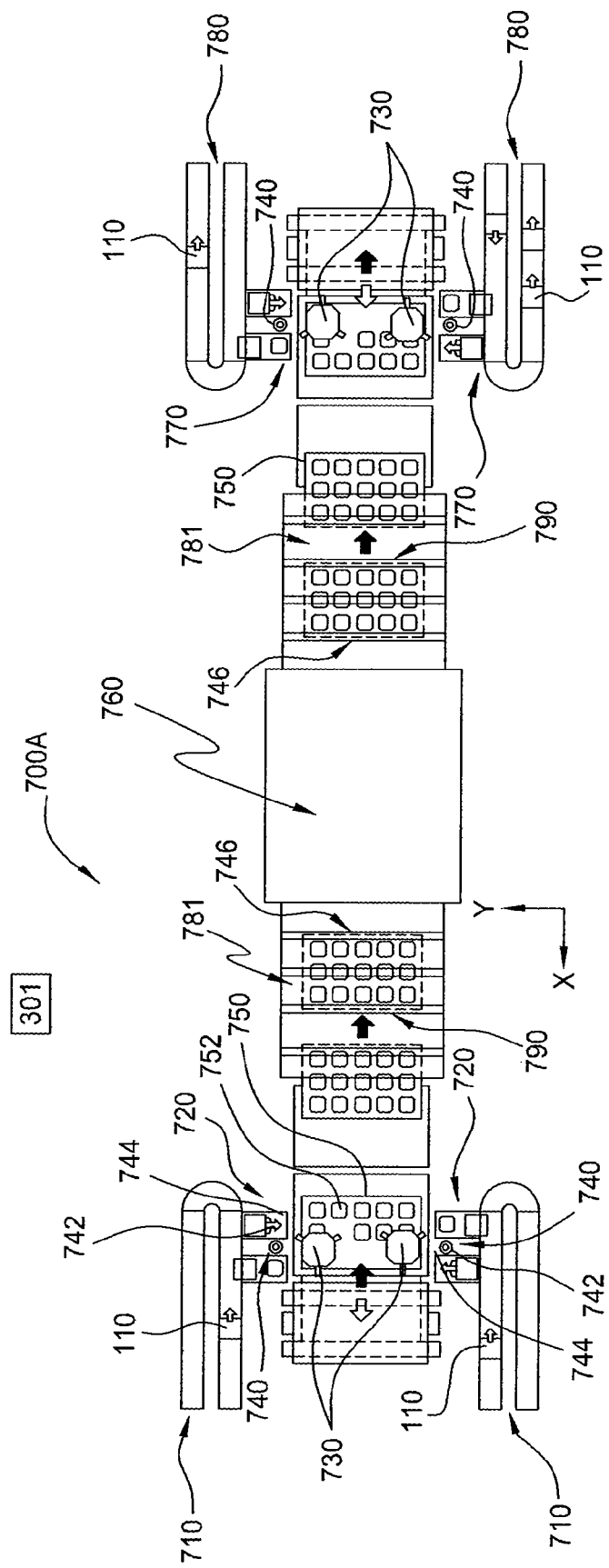
FIG. 7A is a schematic plan view of an apparatus for performing a process sequence according to another embodiment of the present invention.
Figure 7B:
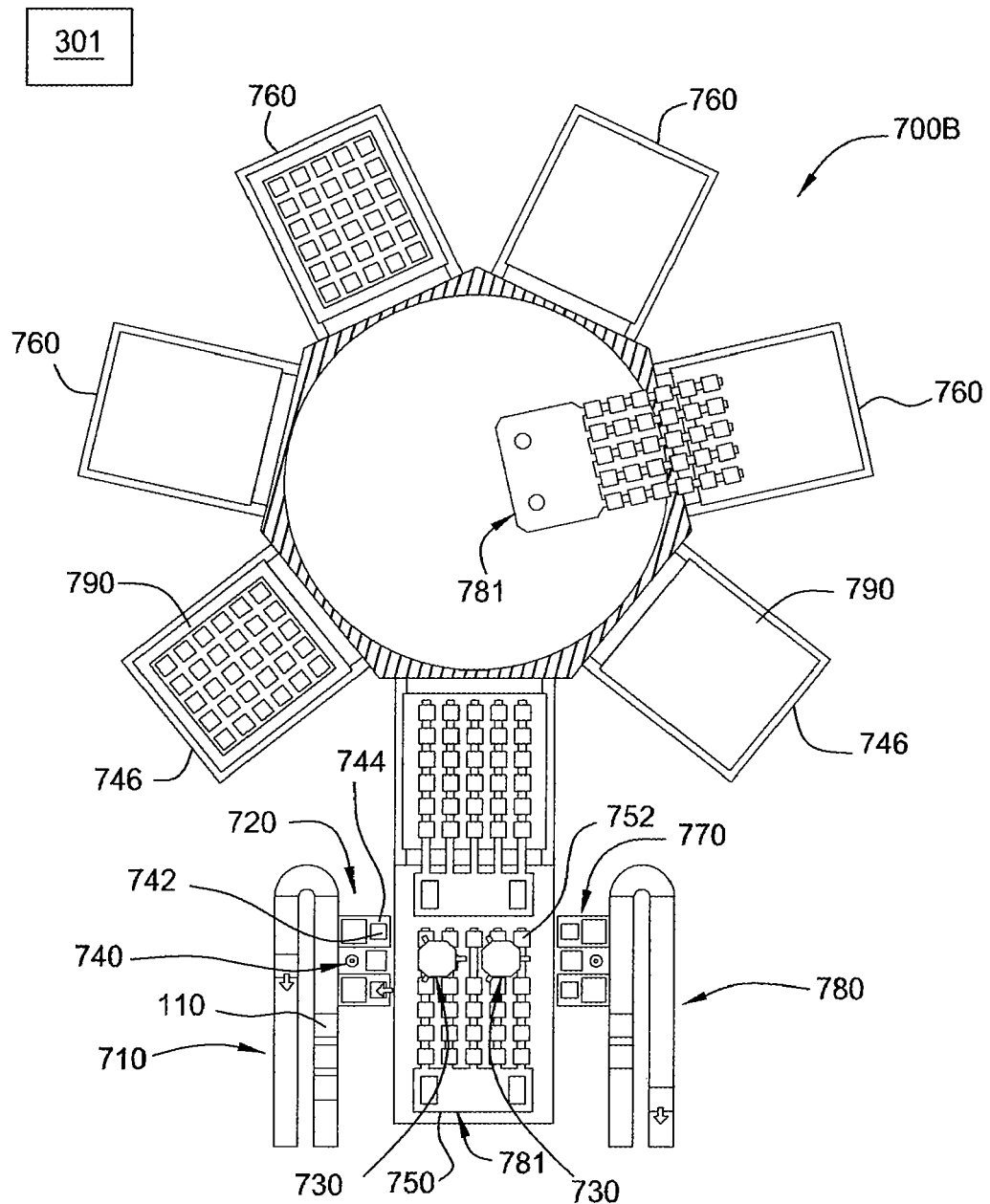
FIG. 7B is a schematic plan view of an apparatus for performing a process sequence according to another embodiment of the present invention.

FIG. 7A is a schematic plan view of an apparatus 700A for performing steps 204-208 according to one embodiment of the present invention. FIG. 7B is a schematic plan view of an apparatus 700B for performing steps 204-208 according to another embodiment of the present invention. In one embodiment, substrates 110 having a dielectric layer 111 deposited on the back surface 120 thereof are transported into a receiving region 720 via an incoming conveyor 710. In one embodiment, the substrates 110 are individually transported on the incoming conveyor 710. In another embodiment, the substrates 110 are transported in cassettes. In another embodiment, the substrates 110 are transported in stack boxes. In one embodiment, a vision system 740 is located within the receiving region 720. In this embodiment, an illumination source 744 may be located on one side of the substrate 110 and an inspection device 742 may be located on the opposite side of the substrate 110. For instance, the inspection device 742 may be located above the substrate 110, while the illumination source 744 is located beneath the substrate 110. In this embodiment, the illumination source 744 may provide back lighting while the inspection device 742 captures images of the substrate 110 and communicates those images to the system controller 301 to determine the precise position of the substrate 110 with respect to an expected position.

In another embodiment, once each individual substrate 110 is delivered into the receiving region 720, a transfer robot 730 retrieves the substrate 110 from the receiving region 720 and holds the substrate 110 over a vision system 740. In one embodiment, as the robot 730 holds the substrate 110 over the vision system 740, the vision system 740 works in conjunction with a system controller 301 to determine the precise position of the substrate 110 with respect to an expected position.

Next, the measurement may be used to precisely position the substrate 110 into a specified feature 752 on a substrate transport surface 750. In one embodiment, the features 752 are pockets and the substrate transport surface 750 is a substrate carrier. In another embodiment, the features 752 are support elements and the substrate transport surface 750 comprises a plurality of lateral arms on a substrate handling robot. In another embodiment, the features 752 are support elements or pockets and the substrate transport surface 750 is a platform portion of an automation system 781, such as the upper surface of a substrate conveyor. In one embodiment, the automation system 781 comprises rollers (not shown) and actuators (not shown) for linearly moving the substrates 110 on the substrate transport surface 750. In one embodiment, the automation system 781 is the substrate handling robot.

After each of the features 752 of the substrate transport surface 750 are filled with patterned substrates 110, the substrates 110 are transported, via the automation system 781, over (in the embodiment where the dielectric layer 111 is provided on the side of the substrate 110 facing down) or under (in the embodiment where the dielectric layer 111 is provided on the side of the substrate 110 facing up) a laser scanner 746 for removing portions of the dielectric layer 111 of each of the substrates 110 positioned on the substrate transport surface 750 according to a desired pattern and in accordance with step 204 described above. In one embodiment, the laser scanner 746 includes a solid state laser, such as the laser device 190. In one embodiment, the laser scanner 746 is configured to move in the Y direction. In such an embodiment, the substrates 110 are indexed one row at a time, via the automation system 781, past the laser scanner 746 for patterning each substrate 110 in the respective row. In another embodiment, the laser scanner 746 is configured to move in the X and Y directions.

In one embodiment, the apparatus 700A or 700B includes a vision system 790 for determining the precise positioning of the substrate transport surface 750 with respect to the laser scanner 746. In one embodiment, the exact position of the substrate transport surface 750 is determined using the vision system 790 and one or more fiducial marks formed on the substrate transport surface 750. The vision system 790 includes detectors that are positioned to view the fiducial marks found on the substrate transport surface 750. The position and angular orientation of the substrate transport surface 750 with respect to the known position of the laser scanner 746 can then be determined by the system controller 301. This offset may then be used to precisely position the laser scanner 746 for patterning the dielectric layer 111 of each substrate 110. In addition, the vision system 790 may be used to inspect the patterned dielectric layer 111 of each substrate 110.

In one embodiment, after patterning the dielectric layer 111 of each substrate 110, the substrates are transported into a deposition chamber 760, such as a PVD chamber or an evaporation chamber, via an automation system 781. In the deposition chamber 760, the conducting layer 114 is deposited over the patterned dielectric layer 111 of each substrate 110 according to step 206 described above.

In one embodiment, after the conducting layer 114 is deposited onto each substrate 110, the substrates 110 are transported out of the deposition chamber 760 via the automation system 781. In one embodiment, another laser scanner 746 then patterns the conducting layer 114 of each substrate 110 according to step 208 described above.

At that point, the same or another robot 730 may remove each substrate 110 from its respective feature 752 and place the substrate 110 into an exit region 770, where it may then be transported away from the apparatus 700A or 700B on an outgoing conveyor 780.

The embodiments illustrated in FIGS. 7A and 7B provide for extremely precise positioning of the laser patterns on layers of the substrate 110 since each individual substrate 110 may be located with respect to the coordinate system of the laser scanner 746 and/or each substrate transport surface 750 may be located with respect to the coordinate system of the laser scanner 746. Additionally, the embodiments of FIGS. 7A and 7B do not affect the substrate throughput of the transfer robot 730 since all patterning processes are performed after loading and/or prior to unloading of the substrates 110.

Figure 8:
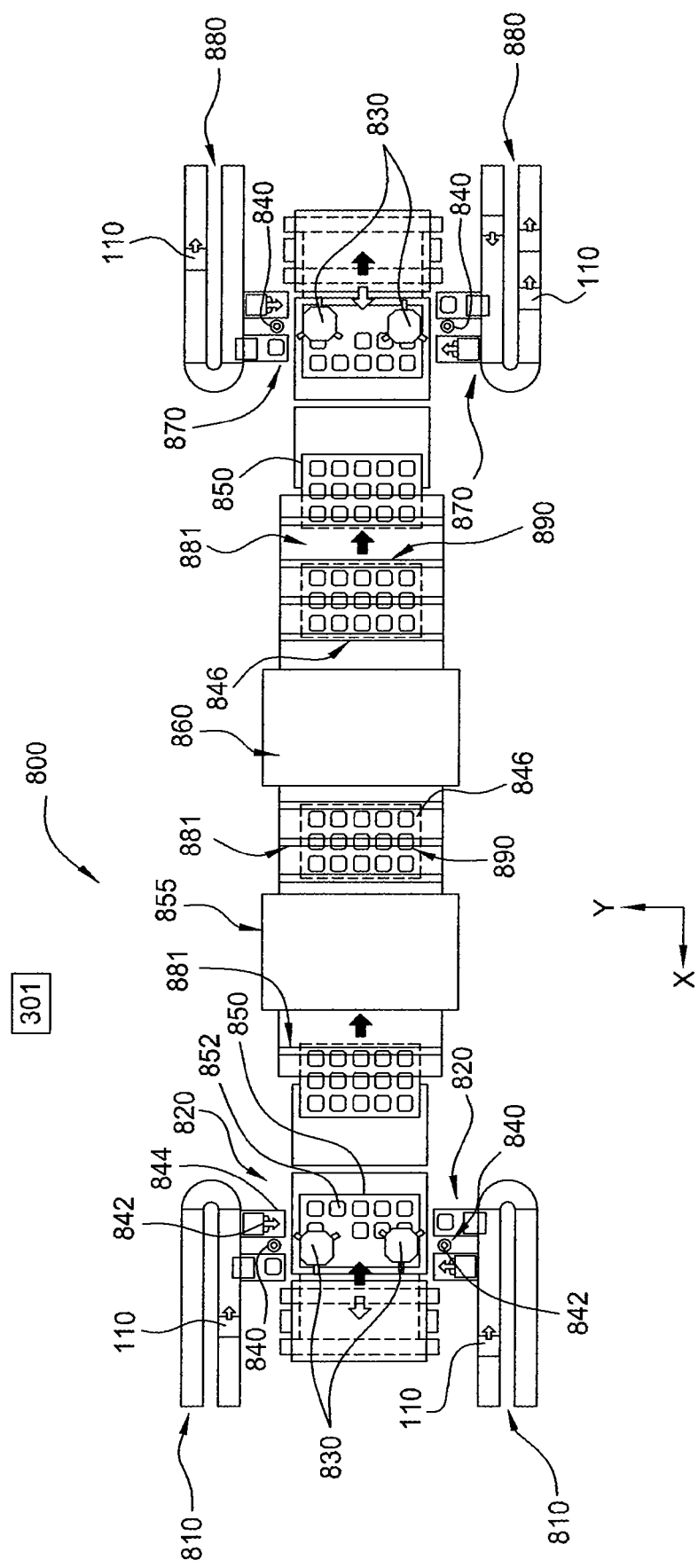
FIG. 8 is a schematic plan view of an apparatus for performing a process sequence according to another embodiment of the present invention.

FIG. 8 is a schematic plan view of an apparatus 800 for performing steps 202-208 according to one embodiment of the present invention. In one embodiment, substrates 110 are transported into a receiving region 820 via an incoming conveyor 810. In one embodiment, the substrates 110 are individually transported on the incoming conveyor 810. In another embodiment, the substrates 110 are transported in cassettes. In another embodiment, the substrates 110 are transported in stack boxes. In one embodiment, a vision system 840 is located within the receiving region 820. In this embodiment, an illumination source 844 may be located on one side of the substrate 110 and an inspection device 842 may be located on the opposite side of the substrate 110. For instance, the inspection device 842 may be located above the substrate 110, while the illumination source 844 is located beneath the substrate 110. In this embodiment, the illumination source 844 may provide back lighting while the inspection device 842 captures images of the substrate 110 and communicates those images to the system controller 301 to determine the precise position of the substrate 110 with respect to an expected position.

Next, the measurement may be used to precisely position the substrate 110 into a specified feature 852 on a substrate transport surface 850. In one embodiment, the features 852 are pockets and the substrate transport surface 850 is a substrate carrier. In another embodiment, the features 852 are support elements or pockets and the substrate transport surface 850 is a platform portion of an automation system 881, such as an upper surface of a substrate conveyor.

After each of the features 852 of the substrate transport surface 850 are filled with patterned substrates 110, the substrate 110 are transported into a deposition chamber 855, such as a CVD chamber or a PVD chamber, via the automation system 881. In one embodiment, the automation system 881 comprises rollers (not shown) and actuators (not shown) for linearly moving the substrates 110 on the substrate transport surface 850. In the deposition chamber 855, the dielectric layer 111 is deposited on the back surface 120 of each substrate 110.

After the dielectric layer 111 is deposited, the substrates are transported to a laser scanner 846 for removing portions of the dielectric layer 111 of each of the substrates positioned on the substrate transport surface 850 according to a desired pattern and in accordance with step 204 described above. In one embodiment, the laser scanner 846 includes a solid state laser, such as the laser device 190. In one embodiment, the laser scanner 846 is configured to move in the Y direction. In such an embodiment, the substrates 110 are indexed one row at a time, via the automation system 881, past the laser scanner 846 for patterning each substrate 110 in the respective row. In another embodiment, the laser scanner 846 is configured to move in the X and Y directions.

In one embodiment, the apparatus 800 includes a vision system 890 for determining the precise positioning of the substrate transport surface 850 with respect to the laser scanner 846. In one embodiment, the exact position of the substrate transport surface 850 is determined using the vision system 890 and one or more fiducial marks formed on the substrate transport surface 850. The vision system 890 includes detectors that are positioned to view the fiducial marks found on the substrate transport surface 850. The position and angular orientation of the substrate transport surface 850 with respect to the known position of the laser scanner 846 can then be determined by the system controller 301. This offset may then be used to precisely position the laser scanner 846 for patterning the dielectric layer 111 of each substrate 110. In addition, the vision system 890 may be used to inspect the patterned dielectric layer 111 of each substrate 110.

In one embodiment, after patterning the dielectric layer 111 of each substrate 110, the substrates 110 are transported into a deposition chamber 860, such as a PVD chamber or an evaporation chamber, via the automation system 881. In the deposition chamber 860, the conducting layer 114 is deposited over the patterned dielectric layer 111 of each substrate 110 according to step 206 described above.

In one embodiment, after the conducting layer 114 is deposited onto each substrate 110, the substrates 110 are transported out of the deposition chamber 860 via the automation system 881. In one embodiment, another laser scanner 846 then patterns the conducting layer 114 of each substrate 110 according to step 208 described above.

At that point, another robot 830 may remove each substrate 110 from its respective feature 852 and place the substrate 110 into an exit region 870, where it may then be transported away from the apparatus 800 on an outgoing conveyor 880.

Figure 9:
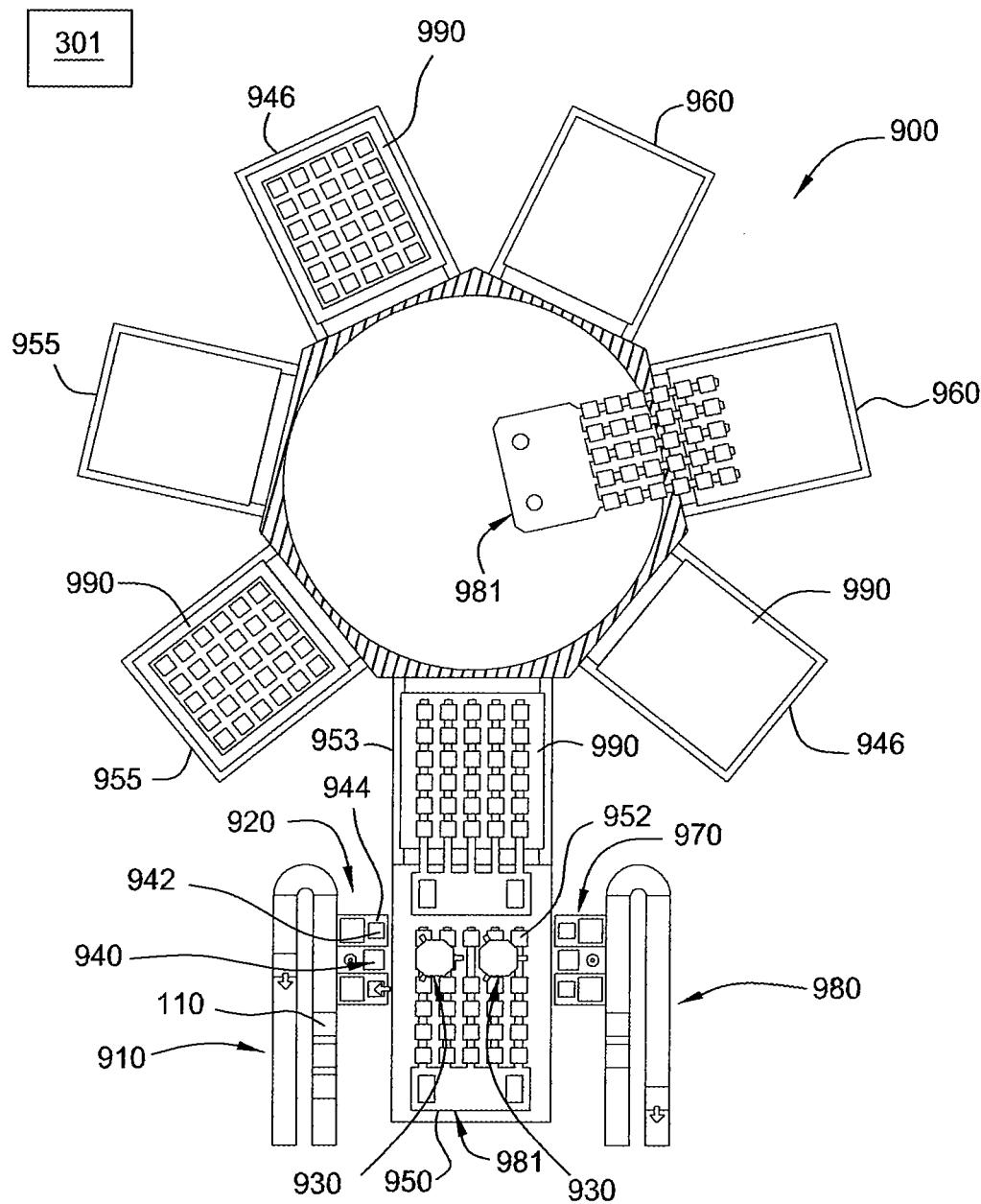
FIG. 9 is a schematic plan view of an apparatus for performing a process sequence according to another embodiment of the present invention.

FIG. 9 is a schematic plan view of an apparatus 900 for performing steps 202-208 according to one embodiment of the present invention. In one embodiment, substrates 110 are transported into a receiving region 920 via an incoming conveyor 910. In one embodiment, the substrates 110 are individually transported on the incoming conveyor 910. In another embodiment, the substrates 110 are transported in cassettes. In another embodiment, the substrates 110 are transported in stack boxes. In one embodiment, a vision system 940 is located within the receiving region 920. In this embodiment, an illumination source 944 may be located on one side of the substrate 110, and an inspection device 942 may be located on the opposite side of the substrate 110. For instance, the inspection device 942 may be located above the substrate 110, while the illumination source 944 is located beneath the substrate 110. In this embodiment, the illumination source 944 may provide back lighting while the inspection device 942 captures images of the substrate 110 and communicates those images to the system controller 301 to determine the precise position of the substrate 110 with respect to an expected position.

Next, the measurement may be used to precisely position the substrate 110 into a specified feature 952 on a substrate transport surface 950. In one embodiment, the features 952 are pockets and the substrate transport surface 950 is a substrate carrier. In another embodiment, the features 952 are support elements, and the substrate transport surface 950 comprises a plurality of lateral arms on a substrate handling robot.

After each of the features 952 of the substrate transport surface 950 are filled with substrates 110, the substrates 110 are transported into a load lock chamber 953 via the automation system 981. In one embodiment, the automation system 981 is the substrate handling robot. Next, in one embodiment, the load lock chamber 953 is pumped down to a desired pressure using a vacuum pump (not shown). After achieving the desired pressure in the load lock chamber 953, the substrates 110 are transported to a deposition chamber 955, such as a CVD or PVD chamber, via the automation system 981. In one embodiment, the automation system comprises an additional substrate handing robot. In the deposition chamber 955, the dielectric layer 111 is deposited on the back surface 120 of each substrate 110 in accordance with step 202 described above.

After the dielectric layer 111 is deposited, the substrates 110 are transported to a laser scanner 946 for removing portions of the dielectric layer 111 of each of the substrates positioned on the substrate transport surface 950 according to a desired pattern and in accordance with step 204 described above. In one embodiment, the laser scanner 946 includes a solid state laser, such as the laser device 190.

In one embodiment, the apparatus 900 includes a vision system 990 for determining the precise positioning of the substrate transport surface 950 with respect to the laser scanner 946. In one embodiment, the exact position of the substrate transport surface 950 is determined using the vision system 990 and one or more fiducial marks formed on the substrate transport surface 950. The vision system 990 includes detectors that are positioned to view the fiducial marks found on the substrate transport surface 950. The position and angular orientation of the substrate transport surface 950 with respect to the known position of the laser scanner 946 can then be determined by the system controller 301. This offset may then be used to precisely position the laser scanner 946 for patterning the dielectric layer 111 of each substrate 110. In addition, the vision system 990 may be used to inspect the patterned dielectric layer 111 of each substrate 110.

In one embodiment, after patterning the dielectric layer 111 of each substrate 110, the substrates 110 are transported into a deposition chamber 960, such as a PVD chamber or an evaporation chamber, via the automation system 981. In the deposition chamber 960, the conducting layer 114 is deposited over the patterned dielectric layer 111 of each substrate 110 according to step 206 described above.

In one embodiment, after the conducting layer 114 is deposited onto each substrate 110, the substrates 110 are transported to the same or a different laser scanner 946 for patterning the conducting layer 114 according to step 208 described above. In one embodiment, the vision system 990 may be used to inspect the patterned conducting layer 114 of each substrate 110.

In one embodiment, the substrates 110 are then moved back into the load lock chamber 953 and then transported out of the load lock chamber 953. At that point, the same or another robot 930 may remove each substrate 110 from its respective feature 952 and place the substrate 110 into an exit region 970, where it may then be transported away from the apparatus 900 on an outgoing conveyor 980.

Laser Removal Methods

As previously presented, the removal of portions of material layers (e.g., dielectric layer 111 or conducting layer 114) may be achieved by the use of a laser device 190. Typically, the material ablation is conducted by pulsing the laser device 190 at a specific frequency, wavelength, pulse duration, and fluence at a specific spot on the substrate 110 to achieve complete evaporation of the material layer. However, it is difficult to achieve complete evaporation of a portion of a material layer, particularly the dielectric layer 111, without damaging the underlying substrate 110.

Figure 10:
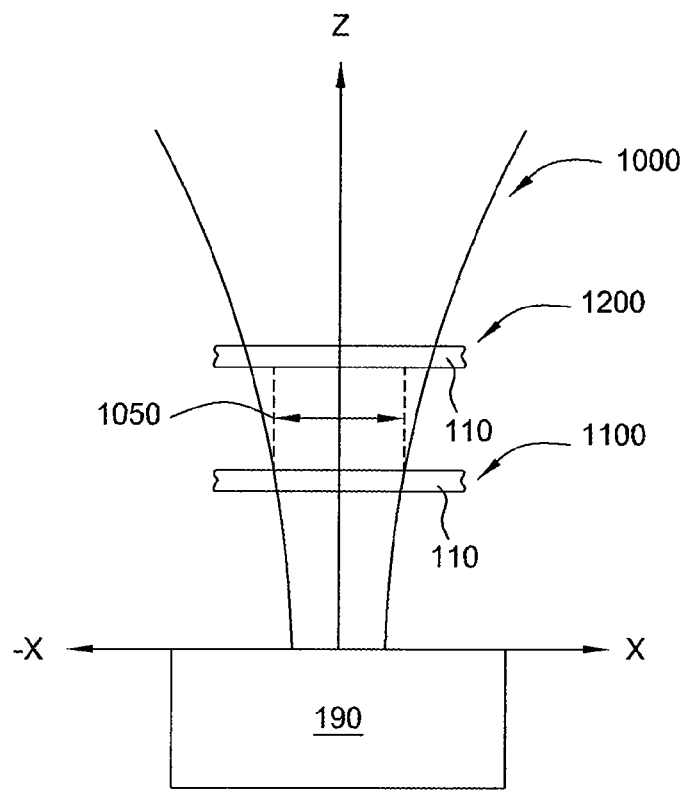
FIG. 10 is a schematic depiction of a laser propagating a beam along a distance from the laser.
Figure 11:
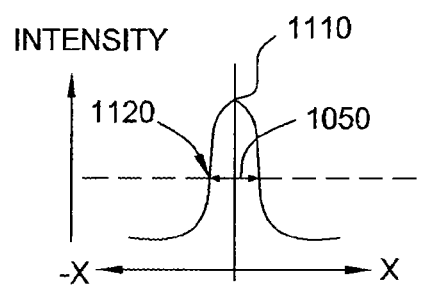
FIG. 11 is a schematic illustration of the Gaussian intensity profile of the beam at a specified position shown in FIG. 10.
Figure 12:
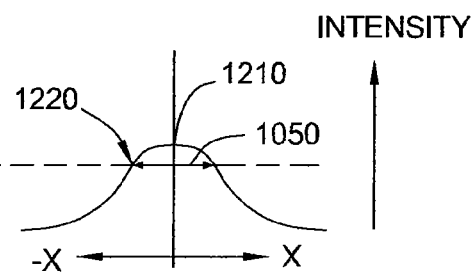
FIG. 12 is a schematic illustration of the Gaussian intensity profile of the beam at an adjusted position shown in FIG. 10 according to one embodiment of the present invention.

One reason for the difficulty in removing a portion of the dielectric layer 111 without damaging the substrate 110 is due to the variation in intensity across the area of the laser spot being focused on the substrate 110. In an ideal laser that emits a beam with a pure Gaussian profile (i.e., operating on the fundamental transverse or $TEM_{00}$ mode), the peak intensity at the center of a desired spot on the material to be removed is higher than around the periphery of the spot. FIG. 10 is a schematic depiction of the laser device 190 propagating a beam 1000 along a distance Z from the laser device 190. FIG. 11 is a schematic illustration of the Gaussian intensity profile of the beam 1000 at the point 1100 in FIG. 10. FIG. 12 is a schematic illustration of the Gaussian intensity profile of the beam 1000 at the point 1200 in FIG. 10.

Referring to FIGS. 10 and 11, the point 1100 on the beam 1000 represents a typical "in focus" positioning of the substrate 110 with respect to the laser device 190, in order to achieve complete evaporation of the dielectric layer 111 across a desired spot 1050. As can be seen, the peak intensity 1110 at the center of the spot 1050 is significantly higher than the peripheral intensity 1120 at the periphery of the spot 1050 because the periphery of the spot 1050 must be set at the ablation threshold of the material of the dielectric layer 111. Thus, although the peripheral intensity 1120 is just high enough to achieve ablation of the dielectric layer 111 along the periphery of the spot 1050, the significantly high peak intensity 1110 causes damage to the underlying substrate 110 at the center of the spot 1050.

In one embodiment of the present invention, complete removal of the dielectric layer 111 across the desired spot 1050 without damaging the substrate 110 is achieved by defocusing the beam 1000 intensity profile delivered to the dielectric layer 111 by, for example, adjusting the position of the substrate 110 relative to the beam 1000. In one example, as shown in FIG. 10, the substrate 110 is moved from a position where the beam is more in focus (e.g., point 1100) to a position being more out of focus (e.g., point 1200). Referring to FIGS. 10 and 12, it can be seen that the peak intensity 1210 at the center of the spot 1050 is just slightly higher than the peripheral intensity 1220 along the periphery of the spot 1050. Because the peak intensity 1210 is significantly lower due to the defocusing of the laser device 190 (i.e., positioning the substrate 110 out of the normal focus region of the beam 1000), complete ablation of the dielectric layer 111 within the desired spot 1050 is removed without causing damage to the underlying substrate 110. Further, although the beam 1000 is emitted on a region of the substrate 110 that is larger than the desired size of the spot 1050, only the portion of the dielectric layer 111 within the spot 1050 is removed because the peripheral intensity 1220 is just high enough to achieve ablation of the dielectric layer 111 along the periphery of the spot 1050. Any area of the dielectric layer 111 that receives the beam 1000 below this threshold is not removed.

In another embodiment, certain optical components (e.g., lenses and beam expanders) are manipulated in order to modify the beam 1000 such that a Gaussian intensity distribution similar to that shown in FIG. 12 is achieved without defocusing the laser device 190. Similarly, complete removal of the dielectric layer 111 is removed within the desired spot 1050 without causing damage to the underlying substrate 110 because the peak intensity is only slightly higher than the peripheral intensity about the periphery of the spot 1050.

Another reason for the difficulty in removing a desired portion of the dielectric layer 111 without damaging the substrate 110 is due to the high pulse energy required to evaporate the dielectric material. In one embodiment of the present invention, significantly lower pulse energies are used to thermally stress and cause physically lift off of the desired region of the dielectric layer 111 rather than evaporating it.

Figure 13:
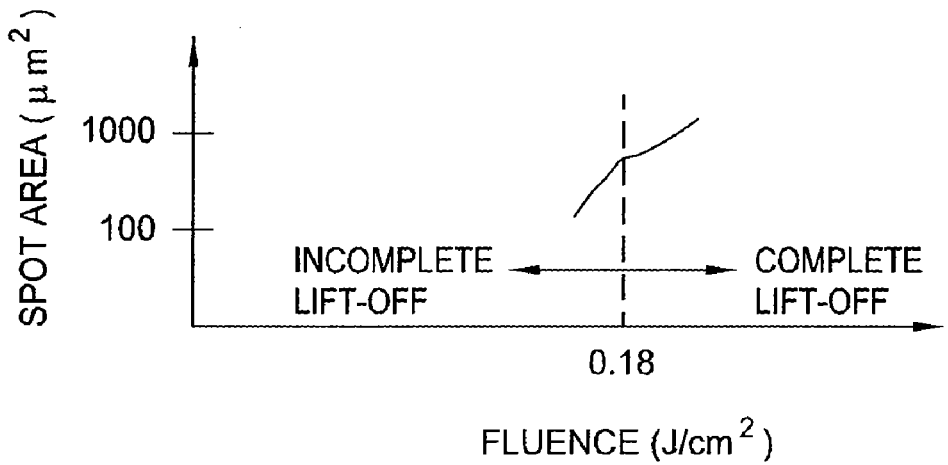
FIG. 13 is a schematic illustration of one example of laser removal caused by thermal stress and physical lift off of a thermally grown oxide according to one embodiment of the present invention.

FIG. 13 is a schematic illustration of one example of laser removal caused by thermal stress and physical lift off of a thermally grown oxide. In one embodiment, the dielectric layer 111 is a silicon oxide having a thickness between about 1000 Å and about 3000 Å thermally grown on the substrate 110. In one embodiment, thermal stress and physical lift off was achieved by the laser device 190 using a pulse duration of from about 10 picoseconds and about 15 picoseconds and a wavelength of about 355 nm. The laser fluence required for complete physical lift off of a spot of the dielectric layer 111 was about 0.18 $J/cm^2$. In this example, any lower fluence did not achieve complete lift off and significantly higher fluence caused damage to the underlying substrate 110.

Figure 14:
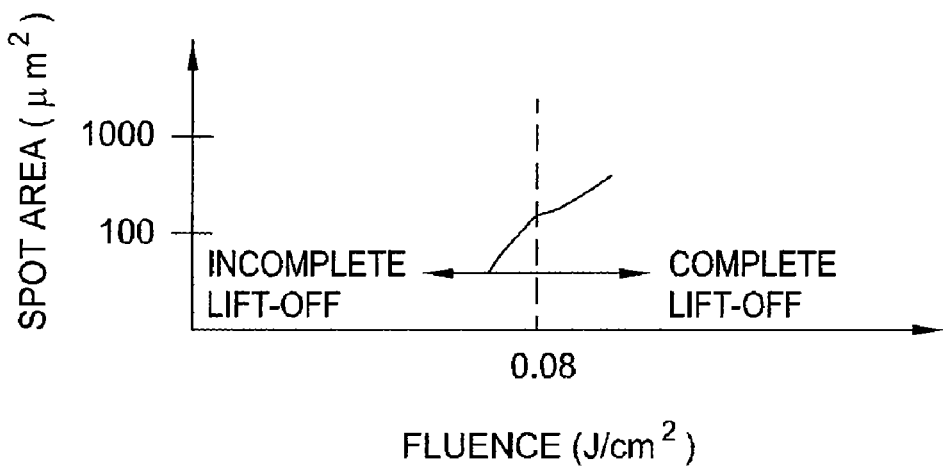
FIG. 14 is a schematic illustration of one example of laser removal caused by thermal stress and physical lift off of a silicon oxide deposited by plasma enhanced chemical vapor deposition (PECVD) according to one embodiment of the present invention.

FIG. 14 is a schematic illustration of one example of laser removal caused by thermal stress and physical lift off of a silicon oxide deposited by plasma enhanced chemical vapor deposition (PECVD). In one embodiment, the dielectric layer 111 is a silicon oxide having a thickness between about 1000 Å and about 3000 Å deposited by PECVD on the substrate 110. In one embodiment, thermal stress and physical lift off was achieved by the laser device 190 using a pulse duration of from about 10 picoseconds and about 15 picoseconds and a wavelength of about 355 nm. The laser fluence required for complete physical lift off of a spot of the dielectric layer 111 was about 0.08 $J/cm^2$. In this example, any lower fluence did not achieve complete lift off and significantly higher fluence caused damage to the underlying substrate 110.

While the foregoing is directed to embodiments of the present invention, other and further embodiments of the invention may be devised without departing from the basic scope thereof, and the scope thereof is determined by the claims that follow.

The invention claimed is:

1. An apparatus for material removal, comprising:
   a first robot configured to transfer a substrate having a dielectric layer deposited on a first surface thereof from an input region to one of a plurality of support features on a substrate transport surface;

a vision system configured to detect an actual position of the substrate and communicate information regarding the actual position to a system controller;

a first laser scanner positioned to remove a portion of the dielectric layer in a desired pattern, wherein the system controller is configured to determine an offset of the actual position with respect to an expected position of the substrate and adjust either the first robot or the laser scanner to correct for the offset; and an automation system configured to transport the substrate having a patterned dielectric layer from the first laser scanner to a deposition chamber configured to deposit a conducting layer over the dielectric layer.

2. The apparatus of claim 1, wherein the substrate is positioned such that a portion of light emitted from the first laser scanner strikes the substrate beneath the ablation threshold while the portion of the dielectric material is removed without damaging the underlying substrate.

3. The apparatus of claim 1, wherein the first laser scanner thermally stresses the portion of the dielectric layer by focusing light on the portion and physically removes the portion of the dielectric layer without evaporating the dielectric material.

4. The apparatus of claim 1, further comprising a second laser scanner positioned to remove a portion of the conducting layer in a desired pattern.

5. The apparatus of claim 4, further comprising a second robot configured to transfer the substrate from the substrate transport surface to an exit region.

6. The apparatus of claim 1, wherein the first robot is configured to hold the substrate with the first surface facing downwardly while the first laser scanner removes the portion of the dielectric layer.

7. The apparatus of claim 6, wherein the system controller is configured determine an offset of the actual position with respect to an expected position of the substrate and adjust either the first robot or the laser scanner to correct for the offset.

8. The apparatus of claim 7, further comprising a second laser scanner configured to remove a portion of the conducting layer while the substrate is held by a second robot.

9. The apparatus of claim 1, further comprising a first substrate holder configured to hold the substrate while the laser scanner removes the portion of the dielectric layer.

10. The apparatus of claim 9, further comprising a second substrate holder configured to hold the substrate while a second laser scanner to removes a portion of the conducting layer.

11. The apparatus of claim 1, wherein the laser scanner is positioned to remove a portion of the dielectric layer from the substrate while the substrate is positioned in the support feature of the substrate transport surface.

12. The apparatus of claim 11, further comprising a second laser scanner configured to remove a portion of the conducting layer from the substrate while the substrate is positioned in the support feature of the substrate transport surface.

13. A processing apparatus, comprising:
a first robot configured to transfer a substrate from an input region to one of a plurality of support features on a substrate transport surface;
a vision system configured to detect an actual position of the substrate and communicate information regarding the actual position to a system controller;
a first deposition chamber configured to deposit a dielectric layer onto the substrate;
a first laser scanner positioned to remove a portion of the dielectric layer from the substrate in a desired pattern while the substrate is positioned on the substrate transport surface, wherein the system controller is configured to determine an offset of the actual position with respect to an expected position of the substrate and adjust the laser scanner to correct for the offset;
a second deposition chamber configured to deposit a conducting layer over the patterned dielectric layer; and
an automation system configured to transport the substrate between the first deposition chamber, the first laser scanner, and the second deposition chamber.

14. The apparatus of claim 13, wherein the substrate is positioned such that a portion of light emitted from the first laser scanner strikes the substrate beneath the ablation threshold while the portion of the dielectric material is removed without damaging the underlying substrate.

15. The apparatus of claim 13, wherein the first laser scanner is configured to thermally stress the portion of the dielectric layer by focusing light on the portion and physically removing the portion of the dielectric layer without evaporating the dielectric material.

16. The apparatus of claim 13, further comprising a second laser scanner positioned to remove a portion of the conducting layer in a desired pattern.

17. The apparatus of claim 16, further comprising a second robot configured to transfer the substrate from the substrate transport surface to an exit region.

* * * * *